United States Patent
Huang et al.

(10) Patent No.: US 6,927,498 B2
(45) Date of Patent: Aug. 9, 2005

(54) BOND PAD FOR FLIP CHIP PACKAGE

(75) Inventors: Tai-Chun Huang, Kaohsiung (TW); Chih-Hsiang Yao, Taipei (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/716,682

(22) Filed: Nov. 19, 2003

(65) Prior Publication Data
US 2005/0104224 A1 May 19, 2005

(51) Int. Cl.[7] .............................................. H01L 23/29
(52) U.S. Cl. ...................... 257/786; 257/698; 257/773; 257/784
(58) Field of Search ................................. 257/779–781, 257/698, 773, 784, 786

(56) References Cited

U.S. PATENT DOCUMENTS

| | | | | |
|---|---|---|---|---|
| 5,527,999 A | * | 6/1996 | Knigga et al. | 174/261 |
| 5,736,791 A | * | 4/1998 | Fujiki et al. | 257/781 |
| 5,923,088 A | * | 7/1999 | Shiue et al. | 257/758 |
| 6,087,732 A | | 7/2000 | Chittipeddi et al. | 257/786 |
| 6,180,265 B1 | | 1/2001 | Erickson | 428/652 |
| 6,187,658 B1 | | 2/2001 | Chittipeddi et al. | 438/612 |
| 6,313,540 B1 | * | 11/2001 | Kida et al. | 257/784 |

* cited by examiner

*Primary Examiner*—Cathy F. Lam
(74) *Attorney, Agent, or Firm*—Thomas, Kayden, Horstemeyer & Risley

(57) ABSTRACT

A bond pad for a flip chip package. The bond pad is suitable for an integrated circuit chip. A plurality of slots are designed in the bond pad. Each of the slots extends along a direction which is perpendicular to a radial direction from the center of the bond pad. The bond pad is deposed at the corner of the integrated circuit chip.

32 Claims, 5 Drawing Sheets

BOND PAD FOR FLIP CHIP PACKAGE

BACKGROUND OF THE INVENTION

1. Field of the Invention

The present invention relates to an integrated circuit packaging technology and in particular to a flip chip packaging technology.

2. Description of the Related Art

The flip chip package is the most space efficient package for very large scale integrated (VLSI) circuits. Flip chip technology is compatible with a variety of circuit board types, including ceramic substrates, printed wiring boards, flexible circuits, and silicon substrates. A flip chip is generally a monolithic semiconductor device, such as an integrated circuit (IC), having bead-like terminals formed on one of its surfaces. The terminals, usually in the form of solder bumps, serve to both secure the flip chip to a circuit board and electrically interconnect the chip circuitry to a conductor pattern formed on the circuit board.

In a flip chip package, an integrated circuit (IC) device usually has a plurality of bond pads distributed over the surface of the device in a rectangular array. These bond pads are used to connect the IC device to the electrical paths on a printed circuit board (PCB). A ball shaped solder bump is formed on each of the bond pads of the IC device. The IC device and the PCB are positioned so that the solder bumps contact the electrical paths on the PCB, and the assembly is heated to reflow the solder, forming electrical and mechanical bonds between the IC device and the PCB.

Erickson, in U.S. Pat. No. 6,180,265, discloses a method for converting an aluminum wire bond to a flip chip solder bump pad, so as to enable an IC device originally configured for wire-bonding attachment to be mounted using a flip chip attachment technique.

Chittipeddi et al., in U.S. Pat. No. 6,187,658 and in U.S. Pat. No. 6,087,732, discloses a method of forming a bond pad for flip chip package integrating the package process with the semiconductor manufacturing process.

The bond pads on the IC device are typically aluminum or an aluminum-base alloy for various known processing and performance-related reasons. FIG. 1A shows a sketch cross-section of a portion of the conventional flip chip package. As well, the cross-section of the entire structure of the conventional flip chip package is shown in FIG. 4. It is understood that chip 100 is conventionally provided with bond pads 102 and solder bumps 104. In order to clearly illustrate the structure of the flip chip package, only one bond pad 102 and one solder bump 104 is shown in the figure. Heat is usually produced during operation of the IC device, causing the expansion of the bond pad 100 and the PCB 106.

However, the thermal expansion coefficient of the bond pad 102 is very different from that of the PCB 106. As shown in FIG. 1B, the structure of the flip chip package subjected to the thermal stress is distorted. Thus, the solder bump 104 easily peels off.

SUMMARY OF THE INVENTION

Accordingly, an object of the invention is to provide a bond pad for a flip chip packaging, wherein the bond pad is structured to release stress, especially thermal stress, such that peeling of the solder bump can be avoided.

One feature of the present invention is to provide slots in a bond pad used in the assembly of a flip chip. When the slot extends along a direction which is substantially perpendicular to a radial direction of the center of the chip, same as thermal expansion direction, thermal stress can be released by the slot, such that solder bump peeling due to the difference of the thermal expansion between the bond pad connected with the upper terminal of the solder bump and the PCB connected with the lower terminal of the solder bump can be avoided. The heat produced by operation of the chip radiates from the center of the bond pad. Various embodiments of the orientation of the slots are described hereinafter.

To achieve the above objects, an embodiment of the present invention provides a bond pad for a flip chip package. The bond pad is used in the assembly of a flip chip. The bond pad is provided with at least one slot extending along a direction which is perpendicular to a radial direction from the center of the integrated circuit chip. The bond pad is deposed at the corner of the integrated circuit chip.

According to the present invention, the bond pad with the designed slot can be preferably located substantially at corners of the integrated circuit chip. Also, the number of the bond pad can be more than one, thus the bond pad is preferably arranged substantially in an array.

According to the present invention, the bond pad is circular or rectangular.

According to the present invention, the slot is preferably rectangular. The slots in the same bond pad are parallel to each other when the number of the slots is more than one. The slot extends at least partially through the bond pad.

Another embodiment of the present invention provides a plurality of bond pads for a flip chip package. The bond pads are used in the assembly of a flip chip. The bond pads are located in each of the quadrants of the integrated circuit chip. Each of the bond pads comprises at least one slot, and each of the slots in the same quadrant extends along a direction which is substantially perpendicular to the diagonal lines of the integrated circuit chip passing through the quadrant in which it is located.

According to the present invention, the slot is rectangular. Each of the slots extends at least partially through the bond pad. The slots in the same quadrant are parallel to each other.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Preferred embodiments of the present invention are now described with reference to the figures.

Figure 4:
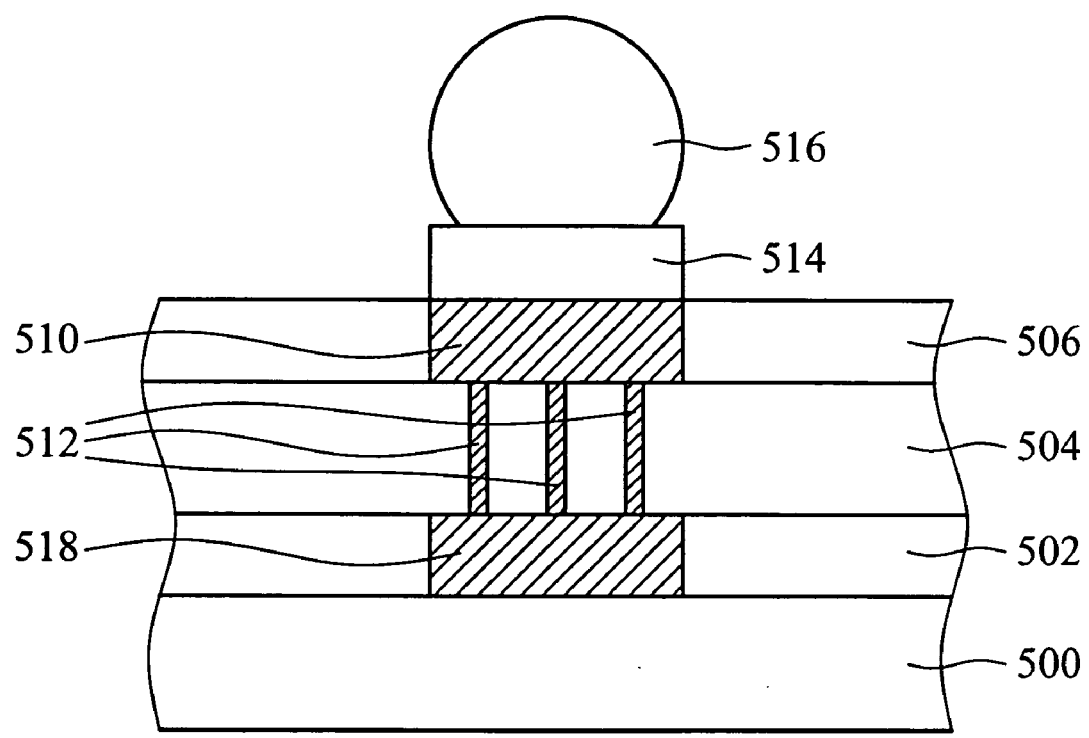
FIG. 4 is a cross-section showing the flip chip package according to one embodiment of the invention.

FIG. 4 shows a cross-section of the conventional bond pad structure. The bond pad structure is constructed on a semiconductor substrate 500. Multilayers comprising interlayer dielectric layers (ILD) 502, 504 are disposed on the semiconductor substrate 500. A lower metal pad 518 is interposed in the interlayer dielectric layers (ILD) 502. An upper metal pad 510 is disposed on the interlayer dielectric layers (ILD) 504 and surrounded by a passivation layer 506. The upper metal pad 510 and the lower metal pad 518 are electrically connected by a plurality of plugs 512. A bond pad 514 is disposed on the upper metal pad 510. A solder bump 516 is further disposed on the bond pad 514 for flip chip package using known solder bumping reflow techniques. The substrate 500 is understood to possibly contain IC devices, such as MOS transistors, resistors, logic devices, and the like, though they are omitted from the drawings for the sake of clarity. In the following, the term "substrate" is meant to include devices formed within a semiconductor wafer and the layers overlying the wafer. The term "substrate surface" is meant to include the uppermost exposed layers on a semiconductor wafer, such as a Si wafer surface, an insulating layer and metal wires. The interlayer dielectric layers (ILD) 502, 504 may comprise $SiO_2$, phosphosilicate glass (PSG), boro-phospho silicate glass (BPSG), and low k materials, such as fluorinated silicate glass (FSG). The passivation layer 506 may comprise silicon nitride. The metal pads 510, 518 may comprise Cu, Al or a Cu/Al alloy. As well, the bond pad 514 may comprises Al or an Al based alloy.

During the operation of the IC device, a large amount of heat is produced, inducing shear stress. The thermal generally radiates from a center position of the surface of the IC device. The solder bump and bond pad is subjected to the shear stress. According to the present invention, the conventional bond pad architecture described above may be utilized. However, the surface of the bond pad of the present invention is patterned to reduce the solder bump shear stress. According to an aspect of the present invention, a plurality of slots which are substantially perpendicular to the radiate direction from the center of the surface of the IC device are provided in the bond pad to release the shear stress. Several embodiments of the arrangements of the bond pad are described hereafter in accordance with the present invention.

First Embodiment

Figure 1A:
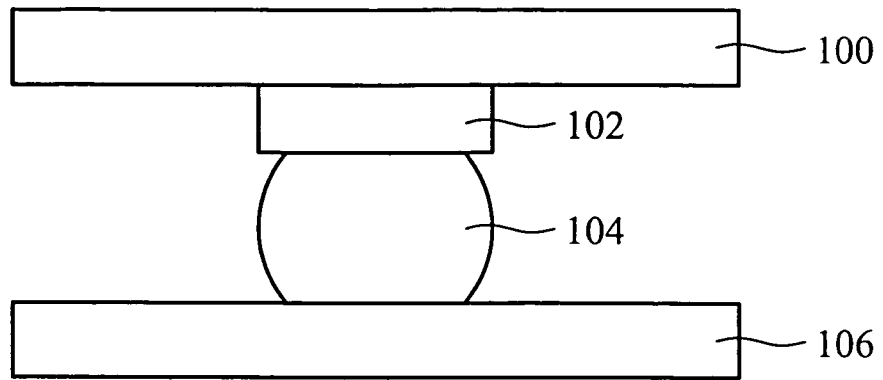
FIGS. 1A through 1B are cross-sections illustrating the thermal expansion problem of the conventional flip chip package.
Figure 1B:
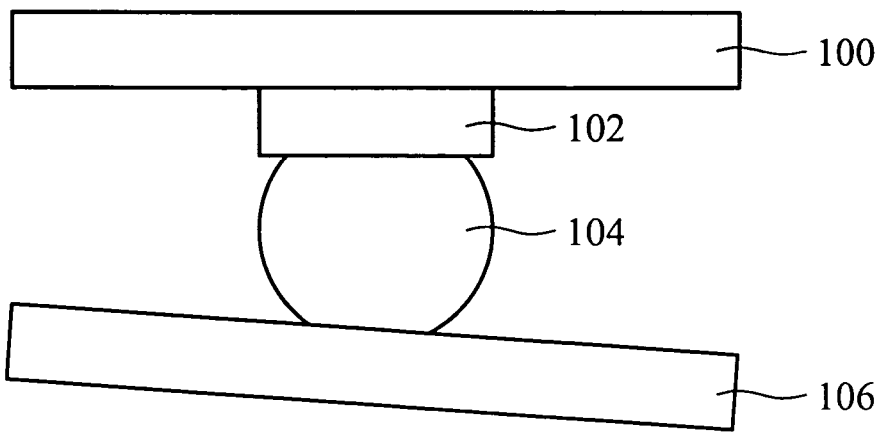
Figure 2A:
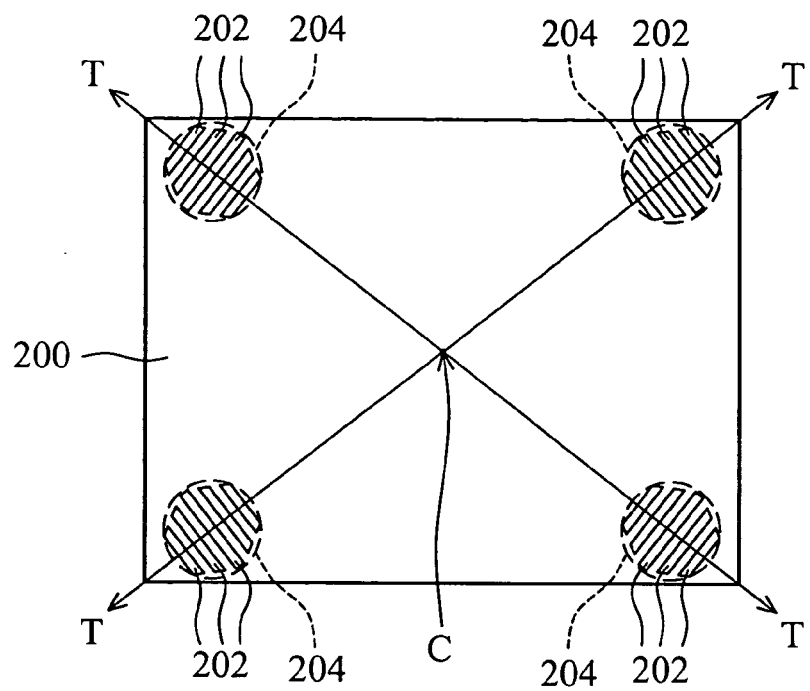
FIGS. 2A through 2B are top-views showing the bond pad for a flip chip package according to one embodiment of the invention, wherein at least one bond pad is deposed at the corner of the integrated circuit chip.
Figure 2B:
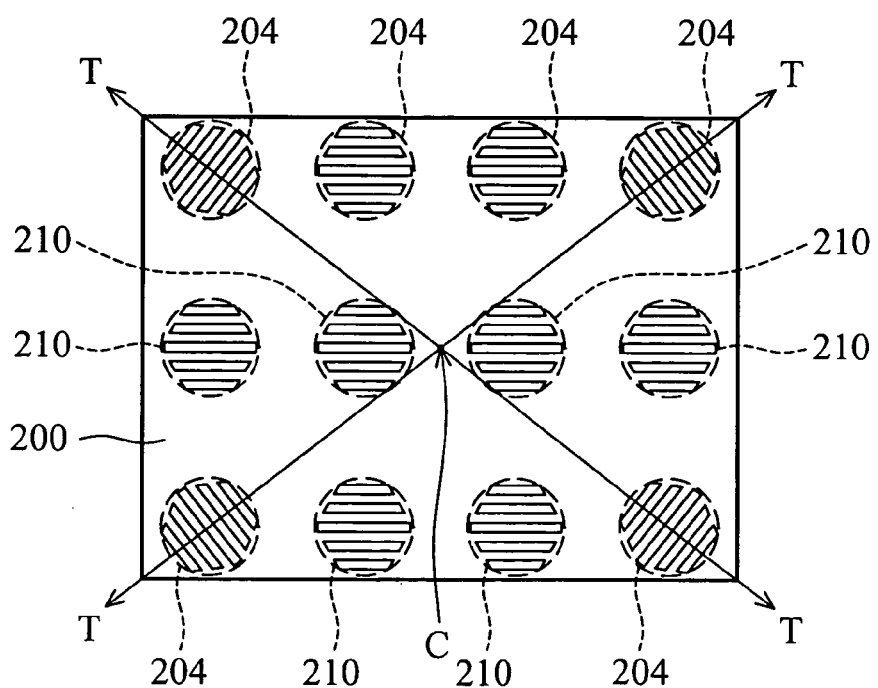

In FIGS. 2A through 2B, the integrated circuit chip 200 is a rectangle shape substrate. The center C of the integrated circuit chip 200 is defined by the intersection of the diagonals of the integrated circuit chip 200. The integrated circuit chip 200 preferably comprises a plurality of bond pad 204 having at least one slot 202 extending along a direction which is perpendicular to a radial direction T from the center C. The bond pad 204 are preferably located substantially at corners of the integrated circuit chip 200. The integrated circuit chip 200 can further comprise additional bond pads 210, as shown in FIG. 2B, wherein all the bond pads 204 and 210 are preferably arranged in an array. The bond pads 204 can comprise a single slot 202 or a plurality of slots 202. The slots 202 are preferably parallel to each other when the number of the slots is more than one. The bond pad 204 can be a rectangular or circular-shaped structure. The slot 202 preferably is rectangular. The slot 202 extends at least partially through the depth of bond pad 200.

The slots 202 may be formed by known photolithography and etching methods.

The slots 202 extend along a direction which is substantially perpendicular to a radiate direction from the center of the surface of the integrated circuit chip 200. Thereby, thermal stress can be released by the slots 202, such that solder bump peeling due to the thermal expansion difference between the bond pad connected with the upper terminal of the solder bump and the PCB connected with the lower terminal of the solder bump can be avoided.

Second Embodiment

Figure 3A:
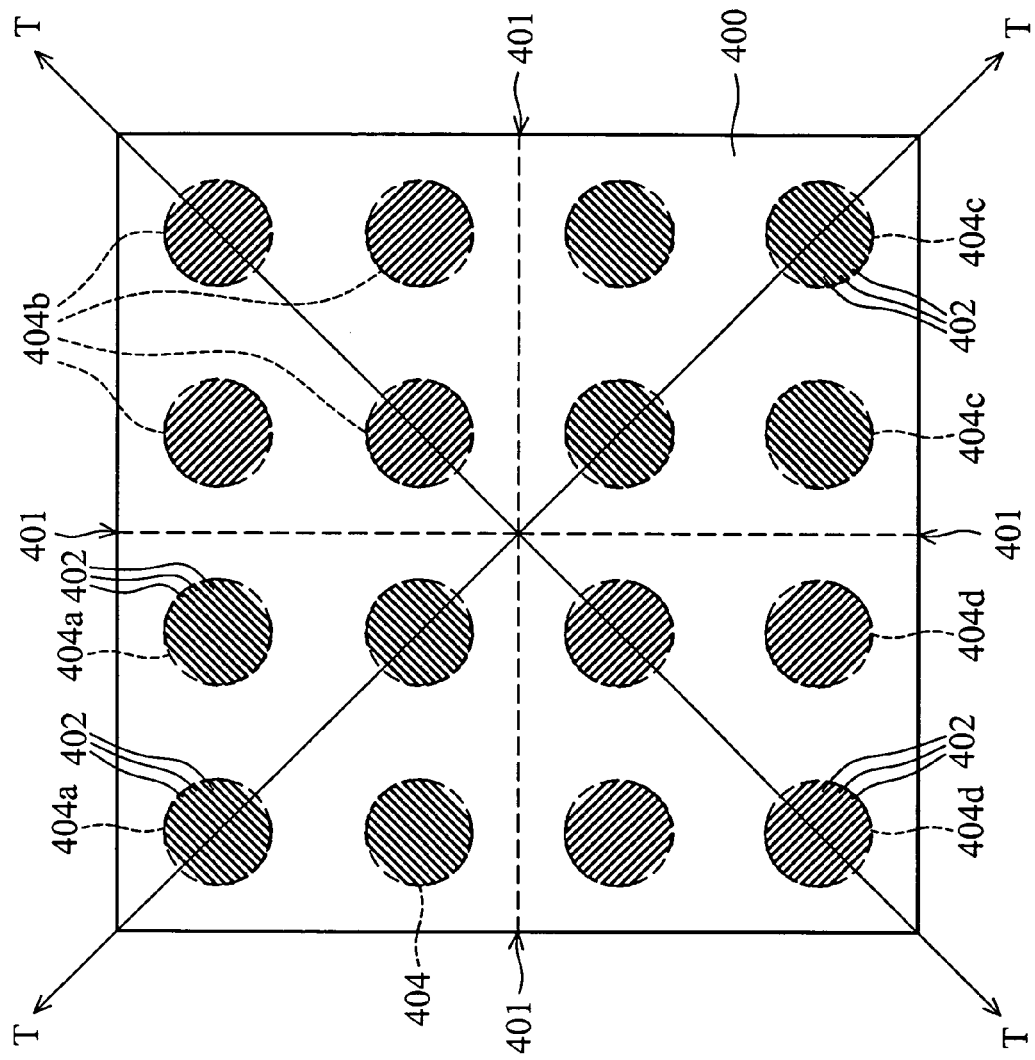
FIGS. 3A through 3B are top-views showing the bond pad is for flip chip package according to another embodiment of the invention, wherein a plurality of bond pads are located in each of the quadrants of the integrated circuit chip, each of the bond pads has at least one slot, and each of the slots in the same quadrant extends along a direction which is substantially perpendicular to the diagonal line of the integrated circuit chip passing through the quadrant in which the bond pads are located.
Figure 3B:
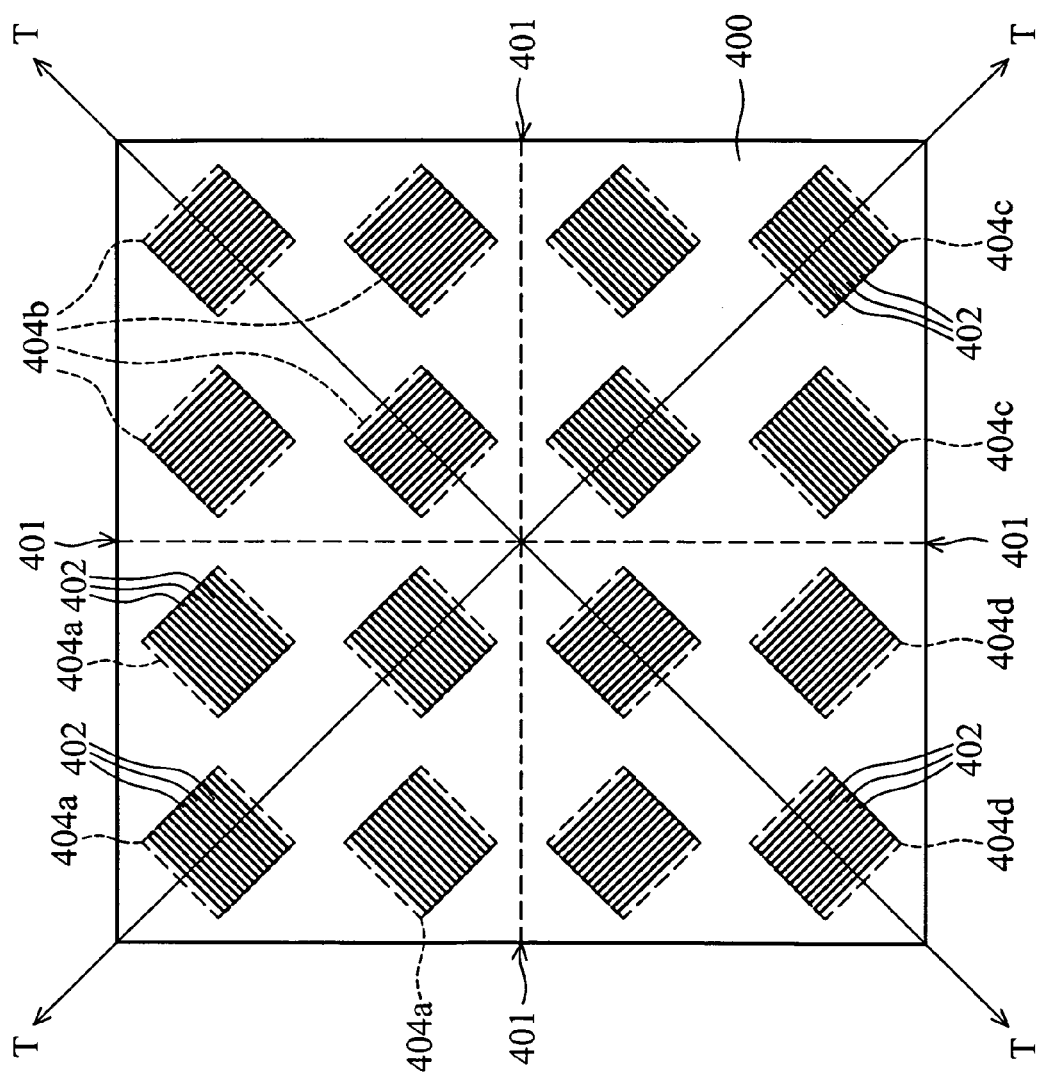

In FIGS. 3A and 3B, an integrated circuit chip 400 is used in the assembly of a flip chip. The integrated circuit chip 400 comprises a plurality of bond pads 404a, 404b, 404c, and 404d located respectively in each of the quadrants of the integrated circuit chip 400. Each of the bond pads 404a, 404b, 404c, and 404d comprises at one slot 402 extending along a direction T which is substantially perpendicular to the diagonal line of the integrated circuit chip 400 passing through the quadrant in which it is located. All the slots 402 disposed in the same quadrant extend along the same direction. For example, all of the bond pads 404a extend along a direction, and all of the bond pads 404b extend along another direction. The bond pads 404a, 404b, 404c, and 404d can be arranged substantially in an array. As shown in FIG. 3A, the bond pads 404a, 404b, 404c, and 404d can be a circular-shaped. As shown in FIG. 3B, the bond pads 404a, 404b, 404c, and 404d can also be a is rectangle-shaped.

The slot 402 preferably is rectangular. The slots 402 of a pattern are parallel to each other when the number of the slots is more than one. The slot 402 extends at least partially through the depth of bond pads 404a, 404b, 404c, and 404d.

The slots 402 may be formed by known photolithography and etching methods.

The slots 402 extend along a direction which is substantially perpendicular to a radiate direction from the center of the surface of the integrated circuit chip 400. Thereby, thermal stress can be released by the slots 402, such that solder bump peeling due to the thermal expansion difference between the bond pad connected with the upper terminal of the solder bump and the PCB connected with the lower terminal of the solder bump can be avoided.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bond pad for a flip chip package, suitable for an integrated circuit chip, comprising:
   at least one slot extending along a first direction, which is perpendicular to a second direction radiating from the center of the integrated circuit chip.

2. The bond pad as claimed in claim 1, wherein the bond pad is located substantially at corners of the integrated circuit chip.

3. The bond pad as claimed in claim 1, wherein the patterns are arranged substantially in an array.

4. The bond pad as claimed in claim 1, wherein the bond pad is circular or rectangular.

5. The bond pad as claimed in claim 1, wherein the slot is rectangular.

6. The bond pad as claimed in claim 1, wherein the slot extends at least partially through the bond pad.

7. The bond pad as claimed in claim 1, wherein the slot extends down to the bottom of the bond pad.

8. A bond pad for a flip chip package, suitable for an integrated circuit chip, comprising:
- a plurality of parallel slots located in the bond pad, each of the slots extending along a first direction, which is perpendicular to a second direction radiating from the center of the integrated circuit chip, wherein the bond pad is disposed at the corner of the integrated circuit chip.

9. The bond pad as claimed in claim 8, wherein the bond pad is circular or rectangular.

10. The bond pad as claimed in claim 8, wherein the slot is rectangular.

11. The bond pad as claimed in claim 8, wherein the slot extends at least partially through the bond pad.

12. The bond pad as claimed in claim 8, wherein the slot extends down to the bottom of the bond pad.

13. A bond pad structure for a flip chip package, suitable for an integrated circuit chip, the integrated circuit chip having a rectangular shape, comprising:
- a plurality of bond pads located in each of the quadrants of the integrated circuit chip, wherein each of the bond pads comprises at least one slot and each of the slots in the same quadrant extending along a direction which is substantially perpendicular to the diagonal lines of the integrated circuit chip passing through the quadrant in which it is located.

14. The bond pad as claimed in claim 13, wherein the patterns are arranged substantially in an array.

15. The bond pad as claimed in claim 13, wherein the slot is rectangular.

16. The bond pad as claimed in claim 13, wherein the slot extends at least partially through the bond pad.

17. The bond pad as claimed in claim 13, wherein the slot extends down to the bottom of the bond pad.

18. The bond pad as claimed in claim 13, wherein the bond pad is circular or rectangular.

19. A semiconductor device, comprising:
- a substrate;
- a conductive layer, disposed on the substrate; and
- at least one bond pad, disposed on the conductive layer, wherein the bond pad comprises at least one slot extending along a first directions which is perpendicular to a second direction radiating from the center of the surface of the substrate.

20. The bond pad as claimed in claim 19, wherein the number of the bond pads located in each quadrant of the integrated circuit chip is more than one, and each of the slots in the same quadrant extending along a direction which is substantially perpendicular to the diagonal lines of the integrated circuit chip passing through the quadrant in which it is located.

21. The bond pad as claimed in claim 19, wherein the slot is rectangular.

22. The bond pad as claimed in claim 19, wherein the slot extends at least partially through the bond pad.

23. The bond pad as claimed in claim 19, wherein the slot extends down to the bottom of the bond pad.

24. A bond pad for a flip chip package, suitable for an integrated circuit chip, comprising:
- a slot extending along a first direction, which is perpendicular to a second direction radiating from the center of the integrated circuit chip,
- wherein the slot is rectangular.

25. The bond pad of claim 24, wherein the bond pad is deposed at the corner of the integrated circuit chip.

26. The bond pad of claim 24, wherein the slot is one of a plurality of parallel slots located in the bond pad.

27. The bond pad of claim 26, wherein each of the slots is rectangular.

28. The bond pad of claim 26, wherein:
- the slot is one of a plurality of slots located in quadrants of the integrated circuit chip; and
- each of the slots in the same quadrant extending along a direction, which is substantially perpendicular to a diagonal line of the integrated circuit chip passing through the quadrant in which each of the slots is located.

29. The bond pad of claim 28, wherein the integrated circuit chip is rectangular.

30. A semiconductor device, comprising:
- a substrate;
- a conductive layer disposed on the substrate; and
- bond pads disposed on the conductive layer;
- wherein:
  - at least one of the bond pads comprises at least one slot extending along a direction perpendicular to a radial direction from the center of the surface of the substrate;
  - each quadrant of the integrated circuit chip comprises at least two of the bond pads; and
  - slots in the same quadrant extend in a direction that is substantially perpendicular to the diagonal line of the integrated circuit chip passing through the quadrant in which each of the slots is located.

31. The semiconductor device of claim 30, wherein the substrate is rectangular.

32. The semiconductor device of claim 31, wherein the slots are rectangular.

* * * * *